(12) United States Patent
Paranthaman et al.

(10) Patent No.: US 8,088,503 B2
(45) Date of Patent: Jan. 3, 2012

(54) CHEMICAL SOLUTION DEPOSITION METHOD OF FABRICATING HIGHLY ALIGNED MGO TEMPLATES

(75) Inventors: Mariappan Parans Paranthaman, Knoxville, TN (US); Srivatsan Sathyamurthy, Knoxville, TN (US); Tolga Aytug, Knoxville, TN (US); Paul N Arendt, Los Alamos, NM (US); Liliana Stan, Los Alamos, NM (US); Stephen R Foltyn, Los Alamos, NM (US)

(73) Assignees: UT-Battelle, LLC, Oak Ridge, TN (US); The Regents of the University of California, Oakland, CA (US)

( * ) Notice: Subject to any disclaimer, the term of this patent is extended or adjusted under 35 U.S.C. 154(b) by 442 days.

(21) Appl. No.: 12/363,035

(22) Filed: Jan. 30, 2009

(65) Prior Publication Data

US 2009/0137401 A1    May 28, 2009

Related U.S. Application Data

(62) Division of application No. 11/143,369, filed on Jun. 2, 2005, now Pat. No. 7,553,799.

(51) Int. Cl.
*H01B 12/00* (2006.01)
*B05D 5/12* (2006.01)
*H01L 39/24* (2006.01)

(52) U.S. Cl. ........ 428/701; 428/702; 428/457; 428/469; 505/237; 505/238; 505/440; 505/445; 505/740; 427/62; 427/126.3; 427/255.19; 427/453

(58) Field of Classification Search .................. 505/230, 505/237–239, 430, 440, 445, 704–705, 735; 428/698, 701–702, 930; 174/125.1; 427/62
See application file for complete search history.

(56) References Cited

U.S. PATENT DOCUMENTS

| | | | |
|---|---|---|---|
| 5,262,394 A * | 11/1993 | Wu et al. .................... 505/237 |
| 5,650,378 A | 7/1997 | Iijima et al. |
| 5,696,392 A | 12/1997 | Char et al. |
| 5,872,080 A | 2/1999 | Arendt et al. |
| 6,800,591 B2 | 10/2004 | Jia et al. |
| 6,884,527 B2 | 4/2005 | Groves et al. |
| 2004/0018394 A1* | 1/2004 | Jia et al. .................... 428/701 |
| 2006/0107891 A1* | 5/2006 | Zurbuchen .................. 117/92 |

FOREIGN PATENT DOCUMENTS

| | | |
|---|---|---|
| WO | 99/25908 | 5/1999 |
| WO | 03/082566 | 10/2003 |
| WO | WO 03/082566 | * 10/2003 |

* cited by examiner

*Primary Examiner* — Stanley Silverman
*Assistant Examiner* — Kallambella Vijayakumar
(74) *Attorney, Agent, or Firm* — Joseph A. Marasco

(57) ABSTRACT

A superconducting article includes a substrate having an untextured metal surface; an untextured barrier layer of $La_2Zr_2O_7$ or $Gd_2Zr_2O_7$ supported by and in contact with the surface of the substrate; a biaxially textured buffer layer supported by the untextured barrier layer; and a biaxially textured superconducting layer supported by the biaxially textured buffer layer. Moreover, a method of forming a buffer layer on a metal substrate includes the steps of: providing a substrate having an untextured metal surface; coating the surface of the substrate with a barrier layer precursor; converting the precursor to an untextured barrier layer; and depositing a biaxially textured buffer layer above and supported by the untextured barrier layer.

16 Claims, 1 Drawing Sheet

CHEMICAL SOLUTION DEPOSITION METHOD OF FABRICATING HIGHLY ALIGNED MGO TEMPLATES

CROSS-REFERENCE TO RELATED APPLICATIONS

This application is a divisional application of U.S. patent application Ser. No. 11/143,369 filed on Jun. 2, 2005, now U.S. Pat. No. 7,553,799, entitled "Chemical Solution Deposition Method of Fabricating Highly Aligned MgO Templates" the entire disclosure of which is incorporated herein by reference.

The United States Government has rights in this invention pursuant to contract no. DE-AC05-00OR22725 between the United States Department of Energy and UT-Battelle, LLC.

FIELD OF THE INVENTION

The present invention relates to superconducting tapes having untextured substrates, and more particularly to chemical solution deposition of barrier layers located between the untextured substrates and textured buffer layers.

BACKGROUND OF THE INVENTION

The fabrication of YBCO coated conductors requires robust and economical production processes. A well known superconductor is $YBa_2Cu_3O_x$ (YBCO), which, in order to exhibit optimum critical current density ($J_c$), is deposited on a buffered substrate, the top layer of which must be biaxially textured to provide a template for epitaxial YBCO growth. Relatively thin buffer layers are needed to optimize the engineering critical current density of YBCO conductor materials.

Well known methods of making conductor materials are ion-beam assisted deposition (IBAD) and inclined substrate deposition (ISD).

Specifically referenced and incorporated herein by reference are: U.S. Pat. No. 6,800,591 issued on Oct. 5, 2004 to Quanxi Jia, et al.; and U.S. Pat. No. 6,884,527 issued on Apr. 26, 2005 to James R. Groves, et al.

OBJECTS OF THE INVENTION

Accordingly, objects of the present invention include provision of biaxially textured templates for laminating superconductors onto untextured substrates.

Further and other objects of the present invention will become apparent from the description contained herein.

SUMMARY OF THE INVENTION

In accordance with one aspect of the present invention, the foregoing and other objects are achieved by a superconducting article that includes a substrate having an untextured metal surface; an untextured barrier layer of $La_2Zr_2O_7$ or $Gd_2Zr_2O_7$ supported by and in contact with the surface of the substrate; a biaxially textured buffer layer supported by the untextured barrier layer; and a biaxially textured superconducting layer supported by the biaxially textured buffer layer.

In accordance with another aspect of the present invention, a method of forming a buffer layer on a metal substrate includes the steps of: providing a substrate having an untextured metal surface; coating the surface of the substrate with a barrier layer precursor; converting the precursor to an untextured barrier layer; and depositing a biaxially textured buffer layer above and supported by the untextured barrier layer.

Figure 1:
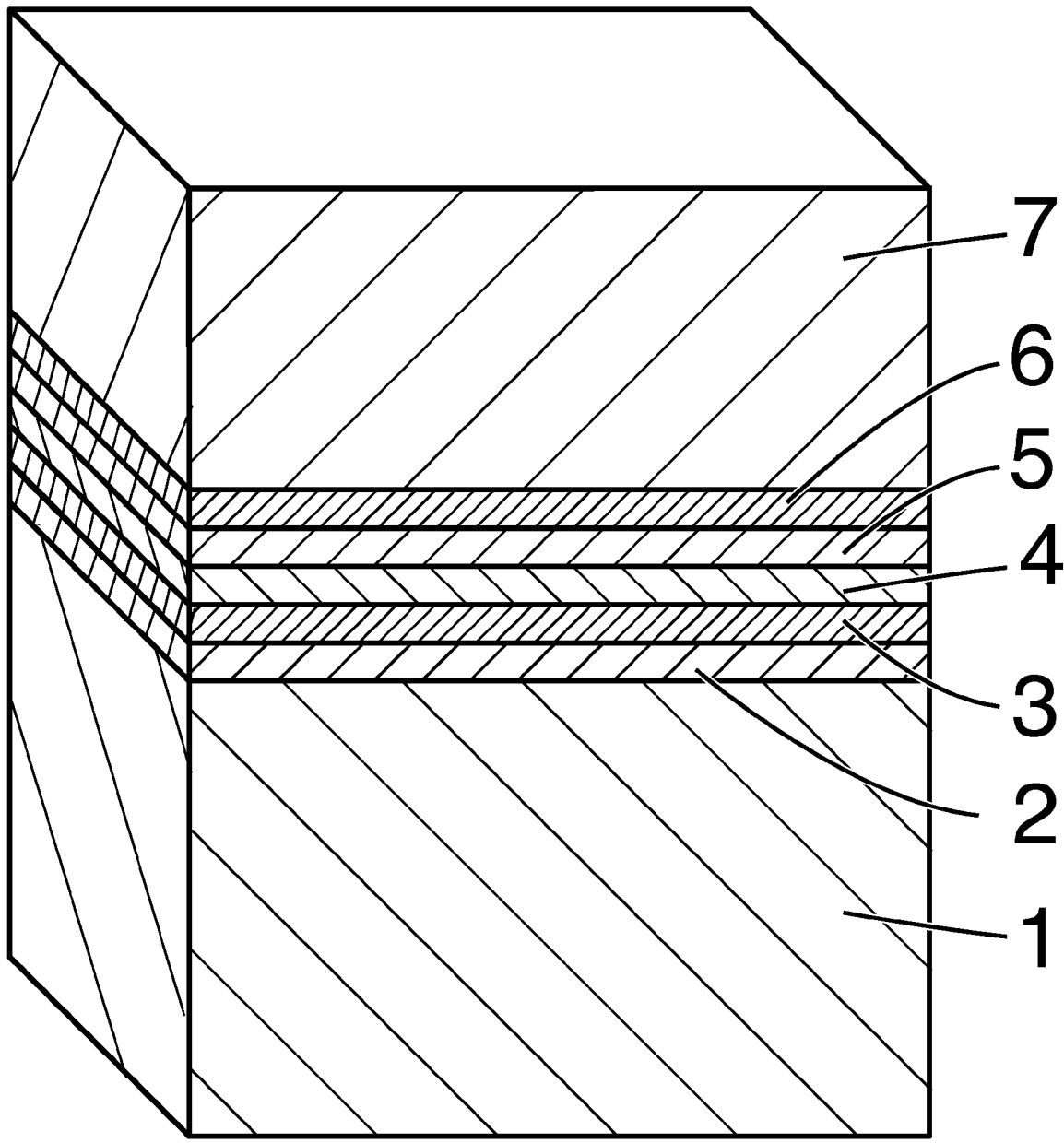
FIG. 1 is a schematic sectional view of a multilayer superconductor.

For a better understanding of the present invention, together with other and further objects, advantages and capabilities thereof, reference is made to the following disclosure and appended claims in connection with the above-described drawings.

DETAILED DESCRIPTION OF THE INVENTION

The present invention relates to a scalable, non-vacuum, solution technique to deposit amorphous or nanocrystalline barrier layers on untextured Ni-alloy substrates to fabricate high performance IBAD MgO Templates. Candidate materials include but are not limited to $La_2Zr_2O_7$ (LZO), $Gd_2Zr_2O_7$ (GZO), $RE_2O_3$ (RE=rare earth element, atomic number 58-71), and $Al_2O_3$ (Alumina). Spin-coating, slot-dye coating, and dip-coating techniques used to deposit nanocrystalline and/or amorphous layers were developed at Oak Ridge National Laboratory (ORNL). Deposition of high quality (6-8° average misalignment) biaxially textured IBAD-MgO and homo-epitaxial MgO on the amorphous layer(s) was developed at Los Alamos National Laboratory (LANL). Deposition of a suitable $SrTiO_3$ cap and YBCO using pulsed laser deposition (PLD) was also developed at LANL. Conductors made in accordance with the present invention have achieved a $J_c$ of at least 300,000 A/cm² and as high as 370,000 A/cm² at 75 K for a YBCO thickness of 1.3 µm.

One architecture for the IBAD based YBCO coated conductors utilizing $CeO_2$, yttria stabilized zirconia (YSZ), and MgO is YBCO/$CeO_2$/YSZ/IBAD-MgO/Ni-alloy. Since a very thin IBAD-deposited MgO layer is sufficient to obtain the necessary biaxial texture, it is important to provide a simplified buffer layer architecture to grow YBCO films. Thinner buffers are needed to increase the engineering critical current density of the YBCO coated conductors.

From previous demonstrations of the growth of YBCO films on $LaMnO_3$ (LMO)-buffered Ni substrates, we expected that the interface between LMO and YBCO should be perfect. Therefore, LMO is an alternate candidate to STO cap layer.

Buffer layer materials which have been successfully used for high-performance YBCO/IBAD-MgO films are $LaMnO_3$, $CeO_2$/$LaMnO_3$, $SrRuO_3$, and $SrTiO_3$. The latter buffer has resulted in reaction free interfaces with the adjacent YBCO and MgO layers and routinely achieved $J_c$s>2 MA/cm² for 1.5 µm thick YBCO films. YBCO films deposited directly on metal or buffered metal substrates delineated the need for intermediate buffering oxide films to ameliorate degradation of the superconductor caused by transition-metal elements (e.g. Ni, Cr, Mn, Mo, etc.) diffusing into it from the substrate. Thus, for improving the substrate diffusion barrier functionalities, one approach is to insert a layer below the IBAD-MgO, which would inhibit the diffusion.

FIG. 1 shows, schematically and not to scale, a multilayer superconductor comprises a substrate 1 that is generally comprised of Ni, a Ni alloy such as Hastelloy C-276, for example, Cu, a Cu alloy, or any other suitable untextured metallic composition. On the substrate is an untextured barrier layer comprising a first untextured sub-layer 2 and an optional second untextured sub-layer 3. The untextured barrier layer may comprise a single layer 2 instead of the two layers 2, 3, or it may comprise further sub-layers. The present invention is directed mainly to the untextured barrier layer.

The multilayer superconductor further comprises a biaxially textured buffer layer 4 deposited via IBAD, ISD, or other method of depositing a biaxially textured material on a non-textured substrate. Once a sufficient amount of material is deposited, a homo-epitaxial layer 5 of the same material may be deposited thereon by a less costly, conventional method such as magnetron sputter deposition, for example. The IBAD layer 4 and the homo-epitaxial layer 5 are generally integral and are generally indistinguishable in the resultant product.

An epitaxial "capping layer" 6 of STO or LMO, for example is deposited on the biaxially textured buffer layer 4 or the homo-epitaxial layer 5, or whatever the case may be. The capping layer can be deposited by any conventional method such as magnetron sputtering and pulsed laser deposition, for example. The final layer is an epitaxial superconductor layer 7 of YBCO, for example.

The multilayer superconductor may comprise additional layers or fewer layers than those described above. The total number of layers is not critical to the invention. Moreover, the compositions of the substrate and the biaxially textured layers are not critical to the invention.

The present invention involves a scalable solution approach to deposit one or more untextured (amorphous or nanocrystalline) layers (for example, 2, 3) of $Al_2O_3$, $La_2Zr_2O_7$ (LZO), $Gd_2Zr_2O_7$ (GZO), etc. onto the substrate 1. A layer thereof having a preferable thickness of about 50-70 nm can be deposited at ambient temperatures on the substrate. Thicknesses of the untextured layer(s) are not particularly critical to the invention, and the skilled artisan will recognize that such layer(s) can be easily adjusted to suit any particular need. Low deposition temperatures enabled by the present invention allow the untextured layer(s) to be untextured (amorphous or nanocrystalline) with the upper surface thereof replicating the smoothness of the substrate.

Films (layers) that are untextured are better diffusion barriers than larger grain polycrystalline films (e.g. buffer layers deposited at high temperatures) of equivalent thickness. The particular materials selected for the untextured layer(s) are advantageous in that, for the processing temperatures relevant to YBCO film deposition; said materials have very low diffusion coefficients for transition metals and oxygen, minimizing the thickness requirement. Moreover, electropolished Ni-alloy substrates have smooth surfaces having a Ra of <1 nm.

Chemical solution (precursor) deposition methods used to carry out the present invention can be grouped into three categories: (i) sol-gel methods that use 2-methoxyethanol as a reactant and solvent; (ii) hybrid methods that use chelating agents such as acetylacetonate or diethanolamine to reduce alkoxide reactivity, and (iii) metal-organic decomposition methods that use high-molecular-weight precursors and water-insensitive carboxylates, 2-ethyl-hexanoates, etc. The sol-gel precursor methods have been used to grow both oxide buffer layers and superconductor layers because of the ease of formation of epitaxial oxides at relatively lower temperatures, control over the polymeric viscous gel formation, and the relatively easy scale-up of the thickness of the films. In this process, metal-organic precursors are coated at room temperature and heat treated at higher temperatures and suitable atmospheres to convert the precursors to highly crystalline buffers with desired cube texture. In accordance with the present invention, it is possible to obtain untextured (e.g., amorphous and/or nanocrystalline) buffers for films processed at lower temperatures.

EXAMPLE I

Sol-gel alkoxide based LZO precursors in a concentration of 0.25-0.5 M 2-methoxyethanol solution were prepared. The precursor solutions were spin-coated with a speed of 2000 rms for 30 sec onto electropolished C276 Ni-alloy substrates. These films were converted at temperatures ranging from 500-700° C. for 30 min. XRD showed the presence of amorphous layers.

EXAMPLE II

Sol-gel alkoxide based LZO precursors in a concentration of 0.25-0.5 M 2-methoxyethanol solution were prepared. The precursor solutions were dip-coated with a line speed of 3-10 m/h onto electropolished C276 Ni-alloy substrates. These films were converted at temperatures ranging from 500-700° C. for 30 min. XRD showed the presence of amorphous layers.

EXAMPLE III

Sol-gel alkoxide based GZO precursors in a concentration of 0.25-0.5 M 2-methoxyethanol solution were prepared. The precursor solutions were spin-coated with a speed of 2000 rms for 30 sec onto electropolished C276 Ni-alloy substrates. These films were converted at temperatures ranging from 500-700° C. for 30 min. XRD showed the presence of amorphous layers.

EXAMPLE IV

Sol-gel alkoxide based GZO precursors in a concentration of 0.25-0.5 M 2-methoxyethanol solution were prepared. The precursor solutions were dip-coated with a line speed of 3-10 m/h onto electropolished C276 Ni-alloy substrates. These films were converted at temperatures ranging from 500-700° C. for 30 min. XRD showed the presence of amorphous layers.

EXAMPLE V

Sol-gel alkoxide based $Y_2O_3$ precursors in a concentration of 0.25-0.5 M 2-methoxyethanol solution were prepared. The precursor solutions were spin-coated with a speed of 2000 rms for 30 sec onto electropolished C276 Ni-alloy substrates. These films were converted at temperatures ranging from 500-700° C. for 30 min. XRD showed the presence of amorphous layers.

EXAMPLE VI

Sol-gel alkoxide based $Y_2O_3$ precursors in a concentration of 0.25-0.5 M 2-methoxyethanol solution were prepared. The precursor solutions were dip-coated with a line speed of 3-10 m/h onto electropolished C276 Ni-alloy substrates. These films were converted at temperatures ranging from 500-700° C. for 30 min. XRD showed the presence of amorphous layers.

EXAMPLE VII

Sol-gel alkoxide based $Al_2O_3$ precursors in a concentration of 0.25-0.5 M 2-methoxyethanol solution were prepared. The precursor solutions were spin-coated with a speed of 2000 rms for 30 sec onto electropolished C276 Ni-alloy substrates.

These films were converted at temperatures ranging from 500-700° C. for 30 min. XRD showed the presence of amorphous layers.

EXAMPLE VIII

Sol-gel alkoxide based $Al_2O_3$ precursors in a concentration of 0.25-0.5 M 2-methoxyethanol solution were prepared. The precursor solutions were dip-coated with a line speed of 3-10 m/h onto electropolished C276 Ni-alloy substrates. These films were converted at temperatures ranging from 500-700° C. for 30 min. XRD showed the presence of amorphous layers.

EXAMPLE IX

C276 Ni-alloy substrates coated with LZO, GZO, $Y_2O_3$, $Al_2O_3$ as described in the examples above were annealed under vacuum at 500-1000° C. to study the barrier diffusion properties of these amorphous layers. $Y_2O_3$ is particularly useful as a second amorphous buffer (layer 3 in FIG. 1) below the IBAD-MgO layer 4.

EXAMPLE X

C276 Ni-alloy substrates coated with LZO, GZO, $Y_2O_3$, $Al_2O_3$ as described in the examples above were used as substrates for IBAD-deposited MgO layers. $SrTiO_3$ cap and YBCO films were subsequently deposited using pulsed laser deposition. The results are shown in Table I.

Two or more sub-layers of untextured barrier material can be deposited and converted separately or together.

The method of the present invention can be used to make conductors, semiconductors, superconductors, fault current limiters, devices, ferroelectric, photovoltaic systems, and other electrical and/or electronic devices.

While there has been shown and described what are at present considered the preferred embodiments of the invention, it will be obvious to those skilled in the art that various changes and modifications can be prepared therein without departing from the scope of the inventions defined by the appended claims.

What is claimed is:

1. A method of forming a buffer layer on a metal substrate comprising the steps of:
    a. providing a substrate having an untextured metal surface;
    b. coating said untextured surface of said substrate with a barrier layer precursor;
    c. converting said precursor to an untextured barrier layer comprising an untextured material selected from the group consisting of $La_2Zr_2O_7$, and $Gd_2Zr_2O_7$, $LaMnO_3$, $RE_3NbO_7$, and $La_{0.7}Sr_{0.3}MnO_3$; and
    d. depositing a biaxially textured buffer layer above and supported by said untextured barrier layer.

2. A method in accordance with claim 1 wherein said substrate further comprises at least one material selected from the group consisting of Ni, Ni alloys, Cu, and Cu alloys.

3. A method in accordance with claim 2 wherein said substrate further comprises stainless steel.

4. A method in accordance with claim 1 wherein said coating step further comprises at least one technique selected from the group consisting of spin coating, slot-die coating, and dip coating.

5. A method in accordance with claim 1 wherein said converting step further comprises heating said coated substrate to a temperature in the range of 300° C. to 800° C. for a period of time not exceeding 75 minutes.

6. A method in accordance with claim 5 wherein said converting step further comprises heating said coated substrate to a temperature in the range of 400° C. to 750° C. for a period of time not exceeding 60 minutes.

7. A method in accordance with claim 6 wherein said converting step further comprises heating said coated substrate to a temperature in the range of 500° C. to 700° C. for a period of time not exceeding 45 minutes.

8. A method in accordance with claim 1 wherein said untextured barrier layer is a first untextured barrier layer and wherein said method further comprises, after said converting step and before said depositing step, the additional steps of:
    a. coating said first untextured barrier layer with a second barrier layer precursor comprising an untextured mate-

TABLE I

| Substrate (LANL) | Barrier Layer (ORNL) | Thickness nm | IBAD-MgO/ΔΦ (LANL) | YBCO/ΔΦ (LANL) | Tc K | Jc; Thickness A/cm²; μm | Comments |
|---|---|---|---|---|---|---|---|
| E-polished C276 | $La_2Zr_2O_7$ Dip-coated | 40-50 | ML204/7.8 | SF1762A/4.4 | 85.2 | 370,000; 1.3 | Substrate OK |
| E-polished C276 | $Gd_2Zr_2O_7$ Dip-coated | 20-30 | ML204/7.4 | SF1762B/5.1 | 86.1 | 30,000; 1.4 | Substrate reacted |
| E-polished C276 | $Y_2O_3$ Dip-coated | 40-50 | ML307(2)/5.6 ML307(3)/8.5 | | | | Substrate reacted |
| E-polished C276 | $Gd_2Zr_2O_7$ Dip-coated | 20-30 | ML3.0(4)/8.7 | | | | Substrate reacted |
| E-polished C276 | LANL standard Ion-beam sputtering $Al_2O_3$ | 70 | ML313(0)/4.9 | | | | Substrate OK |
| E-polished C276 | $Y_2O_3$ Dip-coated | 40-50 40-50 | ML313(1)/8.1 ML313(2)/8.9 | | | | Substrate reacted |
| E-polished C276 | $Gd_2Zr_2O_7$ Dip-coated | 20-30 40-50 40-50 | ML313(3)/9.1 ML313(4)/8.9 ML313(5)/10.6 | | | | Substrate reacted | rial selected from the group consisting of $La_2Zr_2O_7$, and $Gd_2Zr_2O_7$, $LaMnO_3$, $RE_3NbO_7$, and $La_{0.7}Sr_{0.3}MnO_3$; and b. converting said second precursor to a second untextured barrier layer.

9. A method in accordance with claim 1 said barrier layer precursor is a first barrier layer precursor and wherein said method further comprises, after said coating step and before said converting step, the additional step of coating said first barrier layer precursor with a second barrier layer precursor.

10. A method in accordance with claim 1 wherein depositing step further comprises a method selected from the group consisting of ion beam assisted deposition and inclined substrate deposition.

11. A method in accordance with claim 10 wherein said biaxially textured buffer layer further comprises at least one biaxially textured material selected from the group consisting of MgO and TiN.

12. A method in accordance with claim 10 wherein said depositing step further comprises the additional step of homo-epitaxial deposition of additional biaxially textured buffer layer material.

13. A method in accordance with claim 1 wherein said depositing step further comprises the additional step of depositing a biaxially textured capping layer onto said biaxially textured buffer layer.

14. A method in accordance with claim 13 wherein said biaxially textured capping layer further comprises at least one biaxially textured material selected from the group consisting of $SrTiO_3$, $LaMnO_3$, $SrRuO_3$, and $RE_3NbO_7$.

15. A method in accordance with claim 13 further comprising the additional step of: depositing a biaxially textured superconducting layer on said biaxially textured capping layer.

16. A method in accordance with claim 15 wherein said biaxially textured superconducting layer further comprises at least one biaxially textured material selected from the group consisting of YBCO and REBCO.

* * * * *